United States Patent
Boisnier et al.

(10) Patent No.: US 11,777,235 B2
(45) Date of Patent: Oct. 3, 2023

(54) ELECTRICAL DISTRIBUTION MODULE COMPRISING PEDESTALS JOINTLY SUPPORTING POWER BARS AND POWER COMPONENTS

(71) Applicant: SAFRAN ELECTRICAL & POWER, Blagnac (FR)

(72) Inventors: Benjamin Boisnier, Moissy-Cramayel (FR); Philippe Pierre Avignon, Moissy-Cramayel (FR); Loïc Lemasson, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 175 days.

(21) Appl. No.: 17/413,363

(22) PCT Filed: Dec. 12, 2019

(86) PCT No.: PCT/FR2019/053033
§ 371 (c)(1),
(2) Date: Jun. 11, 2021

(87) PCT Pub. No.: WO2020/128241
PCT Pub. Date: Jun. 25, 2020

(65) Prior Publication Data
US 2022/0037862 A1 Feb. 3, 2022

(30) Foreign Application Priority Data

Dec. 21, 2018 (FR) ...................................... 1873861

(51) Int. Cl.
*H02B 1/50* (2006.01)
*H01R 9/24* (2006.01)
*H02B 1/20* (2006.01)

(52) U.S. Cl.
CPC ............. *H01R 9/2416* (2013.01); *H02B 1/20* (2013.01); *H02B 1/50* (2013.01)

(58) Field of Classification Search
None
See application file for complete search history.

(56) References Cited

U.S. PATENT DOCUMENTS 4,646,199 A * 2/1987 M'Sadoques .......... H02B 1/056
361/652
5,351,165 A * 9/1994 Hancock ................ H02B 1/056
174/68.2

(Continued)

FOREIGN PATENT DOCUMENTS

DE 10 2008 009 913 A1 8/2009
DE 10 2013 212 263 A1 12/2014
EP 2 328 392 A2 6/2011

OTHER PUBLICATIONS

International Search Report dated May 7, 2020 in PCT/FR2019/053033 filed on Dec. 12, 2019, 2 pages.

(Continued)

*Primary Examiner* — Courtney L Smith
(74) *Attorney, Agent, or Firm* — Oblon, McClelland, Maier & Neustadt, L.L.P.

(57) ABSTRACT

An electrical distribution module, including a plate that supports pedestals which in turn support power components and power bars connected to the power components. Each pedestal includes a base supporting uprights spaced apart from each other and bridges, each bridge connecting two consecutive uprights at a distance from the base to form an opening for a power bar to transition between the plate and the power components supported by the pedestal.

8 Claims, 5 Drawing Sheets

(56) References Cited

U.S. PATENT DOCUMENTS

| | | | | |
|---|---|---|---|---|
| 5,978,209 | A * | 11/1999 | Montague | H02B 1/056 |
| | | | | 200/50.01 |
| 6,229,692 | B1 * | 5/2001 | Stendardo | H02B 1/056 |
| | | | | 174/68.2 |
| 9,153,893 | B2 * | 10/2015 | Yamada | H01R 9/24 |
| 10,158,184 | B2 * | 12/2018 | Boisnier | H01R 9/223 |
| 10,535,983 | B2 * | 1/2020 | Boisnier | H02B 1/056 |
| 2003/0232532 | A1 * | 12/2003 | West | H01R 13/514 |
| | | | | 439/212 |
| 2014/0008781 | A1 | 1/2014 | Nishi et al. | |
| 2022/0094144 | A1 * | 3/2022 | Boisnier | H05K 7/1432 |

OTHER PUBLICATIONS

French Preliminary Search Report (with English translation of Categories of Cited Documents) dated Nov. 1, 2019 in French Application 1873861 filed on Dec. 21, 2018, 2 pages.

* cited by examiner

ELECTRICAL DISTRIBUTION MODULE COMPRISING PEDESTALS JOINTLY SUPPORTING POWER BARS AND POWER COMPONENTS

TECHNICAL FIELD

The invention relates to an electrical distribution module for aeronautical application, carrying power components supplied by power bars, such a module, also known as a power core, typically forming part of an electrical distribution cabinet in which several modules are mounted.

STATE OF PRIOR ART

In the example of FIG. 1, an electrical distribution module 1 for being installed in an aircraft electrical cabinet comprises a plate 2 equipped with two terminal blocks 3, 4, which carries a first, a second and a third power component 6, 7, 8 connected in series to each other and to these terminal blocks, through four sets of power bars 11, 12, 13, 14 jointly forming a series circuit.

These power components 6-8 are, for example, switching elements and/or circuit breakers withstanding high powers, whereby the power supply can be 115 VAC at 250 A, or 230 VAC at 175 A in AC, or 28 VDC at 400 A in DC.

The busbars 11-14 together form a power circuit from the first terminal block 3, through the components 6-8, to the second terminal block 4 in an arrangement in which these bars are spaced apart from each other and from the plate 2. Each component is located above and spaced apart from the busbars while being electrically connected to the same.

More particularly, the first set of busbars 11 comprises three bars connecting the first terminal block 3 to a base 16 of the first component 6, the second and third set of bars 12 and 13 connect the base 16 to a base 17 of the second component 7 and to a base 18 of the third component 8 respectively. The fourth set of bars 14 connects the base 18 to the second terminal block 4.

Holding the busbars apart from each other and from the plate 2, as well as supporting the components 6-8 both away from and connected to these busbars requires, as can be seen in FIG. 1, a complex arrangement. This arrangement includes a large number of components, and it has to be redesigned for each module configuration, which leads to high development and manufacturing costs.

The purpose of the invention is to provide a solution to make a module of the type shown in FIG. 1 simpler and more compact so that it is less expensive to manufacture and easier to integrate into a given aircraft architecture.

DISCLOSURE OF THE INVENTION

To this end, one object of the invention is an electrical distribution module, comprising a plate to which pedestals carrying power components and power bars connected to these power components are attached, characterised in that each pedestal comprises a base for attaching to the plate provided with posts spaced apart from one another and bridges each connecting two consecutive posts, each bridge being at a distance from the base to delimit with this base and with the posts which it joins together an opening for a power bar to pass between the plate and the power component carried by this pedestal.

With this arrangement, power bars can run under a power component without necessarily being connected to it, in order to be connected to another neighbouring power component. This makes it possible to provide a compact module arrangement.

The invention also relates to a module thus defined, wherein the posts of each pedestal protrude from the bridges in a direction away from the base to delimit a notch suitable for receiving a power bar end between each pair of consecutive posts. The invention also relates to a module thus defined, wherein each bridge has a face opposite to the base in which a threaded hole is formed, which receives a screw passing through a base of the power component carried by the pedestal and a power bar end received in the notch delimited by that bridge and the posts which it joins, for jointly attaching the base of the power component to the pedestal and electrically connecting the power bar end to the base of the power component.

The invention also relates to a module thus defined, wherein each bridge includes a side face in which an additional threaded hole is formed, which receives a screw passing through a section of a power bar and an electrical terminal of a supply member for jointly attaching the power bar to the bridge and electrically connecting it to the electrical terminal of the supply member.

The invention also relates to a module thus defined, wherein each power component is carried by two pedestals.

The invention also relates to a module thus defined, wherein each pedestal has a hole at each end of its base through which it is attached by screwing to the plate.

The invention also relates to a module thus defined, wherein each pedestal has studs projecting from its base and by which it is attached to the plate by fitting these studs into corresponding holes in the plate.

The invention also relates to a module thus defined, wherein each pedestal has four posts to delimit three openings and three notches and wherein each pedestal carries a three phase power component.

DETAILED DISCLOSURE OF PARTICULAR EMBODIMENTS

The idea underlying the invention is to design an electrically insulating pedestal to be mounted to a plate to carry a power component at a distance from this plate while carrying power bars along the component ensuring their connection to it and through which other bars, closer to the plate and which are not necessarily connected to the component it carries, pass.

Figure 1:
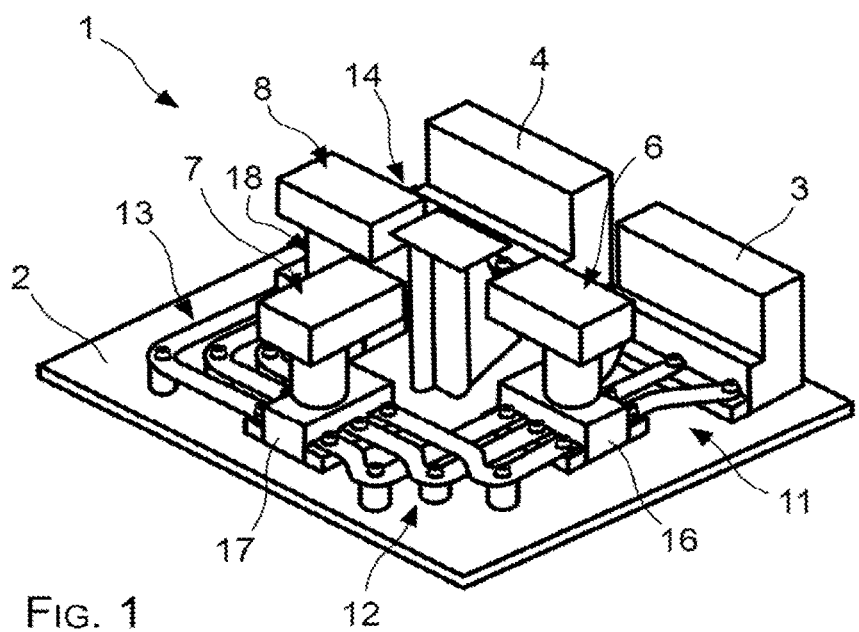
FIG. 1 is an overview of a known distribution module.
Figure 2:
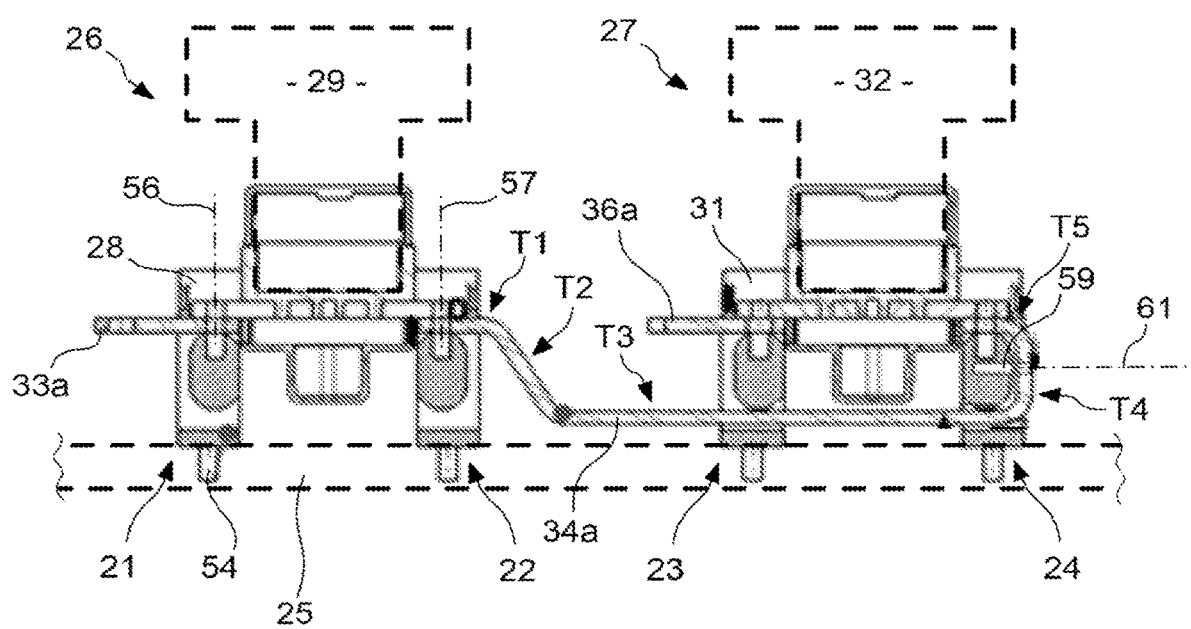
FIG. 2 is a cross-section view of part of the module according to the invention.

In FIG. 2, part of a power module according to the invention comprises four pedestals 21 and 22, 23, 24 attached to an upper face of a plate 25. The pedestals 21 and 22 together carry a first power component 26 comprising a body 29 fitted into a base 28 which is attached to the pedestals 21 and 22 and which is located away from the plate 25. Similarly, pedestals 23 and 24 carry a second power component 27 comprising a body 32 fitted into a base 31 away from plate 25 and attached to pedestals 23 and 24.

These four pedestals 21-24 jointly carry three sets of power bars 33, 34 and 36, ensuring holding of these bars between the plate 25 and the components 26 and 27, and ensuring electrical connection of these bars to the bases 28 and 31 of these components. The first set of bars 33 comprises three bars marked 33a, 33b and 33c, the second set of bars 34 comprises three other bars 34a, 34b and 34c, and the third set of bars 36 comprises three bars 35a, 35b and 35c.

Figure 4:
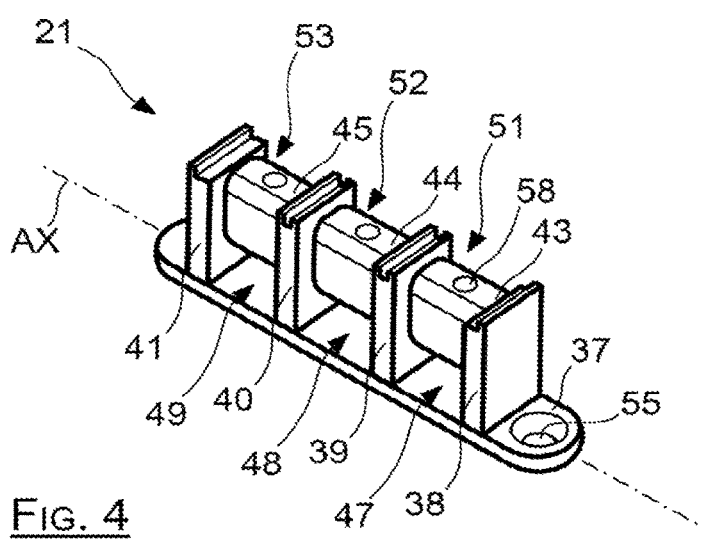
FIG. 4 is a first perspective view of a pedestal of the module according to the invention.

The pedestal 21, which appears alone in FIG. 4, is an electrically insulating element, especially made of polyetheretherketone (PEEK), comprising a base 37 which resembles an oblong plate of a small width in comparison with its length, which extends along a main direction noted AX. This base 37 carries four support posts 38-41 which project from its upper face and are evenly spaced from each other along direction AX to define three spaces each for receiving two power bars one above the other. Each post 38-41 is shaped like a rectangular plate of the same width as the base 37 and oriented in a plane normal to axis AX.

Complementarily, the pedestal 21 includes three bridges 43, 44 and 45 connecting posts 38 and 39, posts 39 and 40, and posts 40 and 41 respectively. Each bridge extends in parallel to axis AX and is located at a distance from the base 37 so as to delimit, with this base 37 and both posts that it connects to each other, an opening for a power bar to pass therethrough, these openings being marked 47-49.

Figure 5:
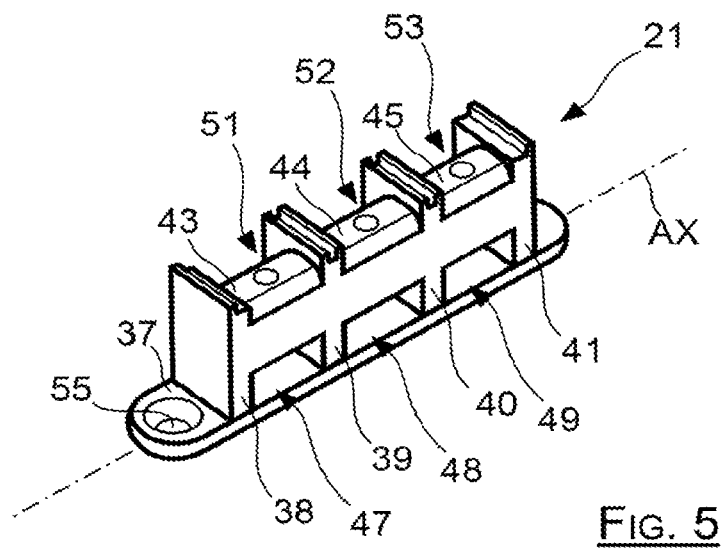
FIG. 5 is a second perspective view of a pedestal of the module according to the invention.

As visible in FIGS. 4 and 5, the posts 38-41 project beyond the bridges 43-45 in the opposite direction to the base 37, so that each bridge defines a U-shaped notch with the two posts it joins. Each notch forms an unclosed upper opening in the pedestal for receiving one end of a power bar, these notches being marked 51, 52 and 53.

The pedestals 22, 23 and 24 are generally identical in structure to the pedestal 21. Each pedestal allows a power component and the ends of power bars to be supported, allowing electrical connection of these ends to the base of the power component while allowing other bars to pass between the base and the plate.

Each pedestal 21-24 may have studs 54 protruding from the lower face of its base 37 to be attached to the plate 25 by fitting these studs 54 into corresponding holes formed in the plate, as in the example in FIG. 2. Alternatively, the base 37 can include attachment holes at its ends such as the attachment hole 55 visible in FIGS. 4 and 5, allowing it to be attached to the plate 25 by screwing.

Figure 3:
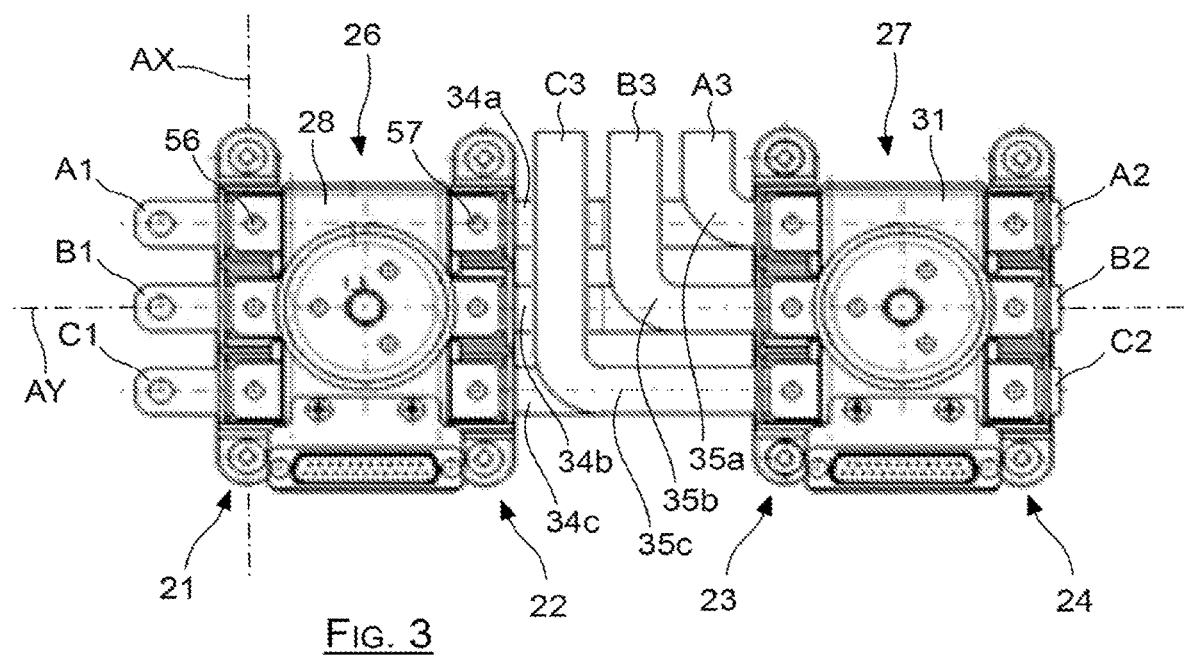
FIG. 3 is a top view of part of the module according to the invention.

As visible in FIGS. 2 and 3, the pedestals 21 and 22 are located at a distance from each other extending in parallel to each other to jointly support the base 28. The pedestal 21 further carries the ends of the three bars 33a-35a of the first set of bars 33 in its upper notches, ensuring electrical connection of these bars to the base 28 of the component 26. The pedestal 22 carries the ends of the three bars 34a-34c of the second set of bars 34 in its upper notches while ensuring electrical connection of these bars 34 to the base 28 of the power component 26.

Figure 6:
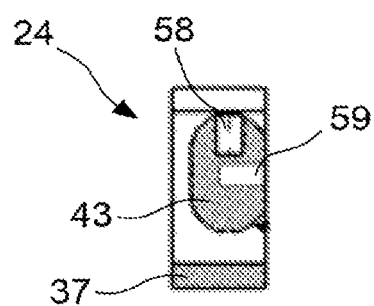
FIG. 6 is a cross-section view of a pedestal of the module according to the invention.

The bar 33a of the first set 33 extends along a direction AY perpendicular to direction AX and parallel to the plate 25. It comprises a free end which forms an output terminal A1 of the module, and an attachment end carried by an upper notch of the pedestal 21 so that this end runs along a lower face of the base 28. This attachment end of the bar 33a is connected to the base 28 through a screw 56 which passes through two aligned holes formed through the base 28 and through the end of the bar to be screwed and tightened into the bridge carrying this attachment end of the bar 33a. Such a threaded hole, marked 58 in FIG. 6, is formed at the upper face of each bridge, that is, the face opposite to the base 37. The screw 56 thus ensures electrical connection of the bar 33a to the base 28 and attachment of this base to the pedestal 21. Similarly, the bar 34a, which also extends along direction AY, includes an attachment end carried by an upper notch in the pedestal 22 to be electrically connected to the base 28. A screw 57 passes through it, which screw also passes through the base and which is screwed into a threaded hole of the bridge of this pedestal 22, this screw 57 also ensuring attachment of the base 28 to the pedestal 22.

The bar 34a thus comprises a first section T1 ending in its end for attachment to the pedestal 22, which extends to a second section T2 tilted with respect to the plane of the plate 25 and itself extending to a third section T3 parallel to the first, that is extending in direction AY. As visible in FIG. 2, the third section T3 passes through a lower opening of the pedestal 23 and a lower opening of the pedestal 24, these two pedestals 23 and 24 jointly carrying the base 31 of the second component 27. The third section T3 is thus kept at a relatively small distance from the plate 25 and at a greater distance from the component 27 which overhangs it.

The third section T3 extends to a fourth section T4 bent at right angles to extend perpendicularly to the plate 25 in order to run along a lateral face of a bridge of the pedestal 24. This fourth section T4 extends to a fifth section T5 bent at right angles to extend in parallel to the third section T3, that is along direction AY, and at a distance therefrom, this fifth section T5 being terminated by a further connection and attachment end of the bar 34a.

As visible in FIG. 2, each bridge of the pedestal 24 includes an additional threaded hole 59 on its side face bordered by a bar portion such as section T4. By virtue of these additional holes 59, the fourth section T4 can be connected to another electrical component not represented in FIGS. 2 and 3, by means of a screw 61 passing through a connection terminal of this component as well as a corresponding hole formed in the fourth section T4 to be screwed into the additional tapped hole 59. The fourth section T4 thus forms a supply terminal A2 of the power bar 33.

The fifth section T5, which extends along direction AY, is engaged in an upper notch of the pedestal 24, so as to extend under the base 31 and alongside it. This fifth section T5 is electrically connected to the base 31 in the same way as the section T1 is connected to the base 28. Thus, a screw not shown passes through this base and a corresponding hole formed in the end of the fifth section T5 to be screwed into a threaded hole in the bridge facing it in order to ensure both connection of the bar 34a to the base 31 and attachment of this base 31 to the pedestal 24.

As visible in FIG. 3, bar 35a extends in parallel to and away from plate 25 while being bent to have a portion extending in direction AY and a portion extending in direction AX between bases 28 and 31 and terminating in a further output terminal A3. This bar 35a has an attachment end received in an upper notch of the pedestal 23 and connected to the base 31 by a screw also ensuring attachment this base 31 to the pedestal 23, that is in the same way as the other bars.

The bars 33b and 33c of the first set 33 have the same shape and orientation as bar 33a, and are carried by the other two notches of the pedestal 21 and connected to the base 28 in the same way as bar 33a. The free ends of these bars 33b and 33c form two further output terminals marked B1 and C1. Bars 34b and 34c have the same shape and orientation as bar 34a, and are carried by the other two lower openings of the pedestals 22, 23 and 24, and by the other two notches of the pedestal 24 to be connected to the base 31 in the same manner as bar 34a while forming two further power terminals marked B2 and C2. Bars 35b and 35c have the same general flat and bent shape as bar 35a by being oriented in the same way as bar 35a. They are carried by the other two upper notches of the pedestal 23 and are connected to the base 31 in the same way as bar 35a, and their free ends define two other output terminals marked B3 and C3.

Under these conditions, each bar 34a-34c of the second set of bars has a section forming a supply terminal, and an end through which it is connected to the first component 26, and another end through which it is connected to the second component 27.

Figure 7:
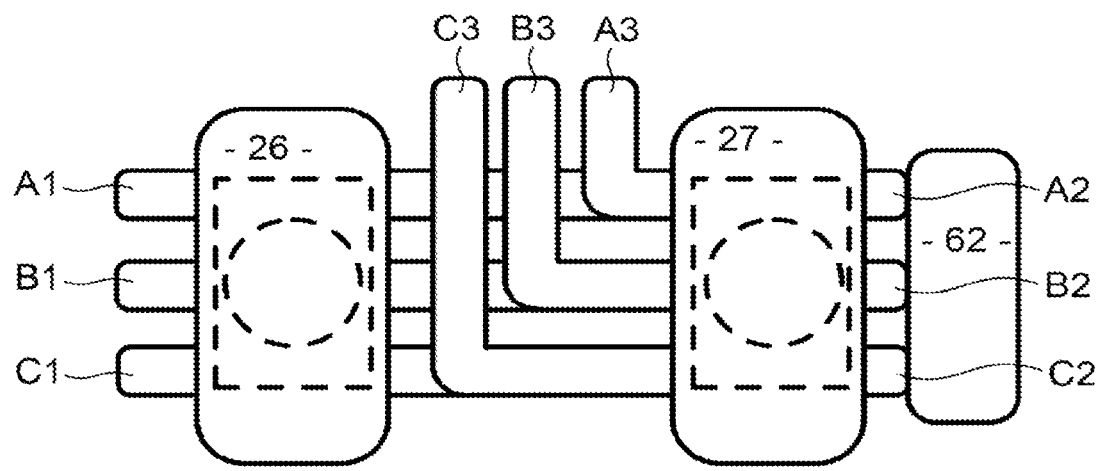
FIG. 7 is an electrical diagram of the module according to the invention.
Figure 8:
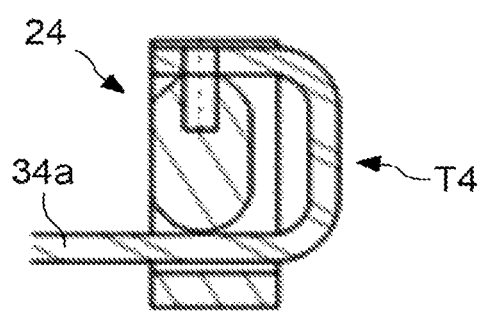
FIG. 8 is a cross-sectional view of a first step of unsecuring a power bar from the pedestal according to the invention.

Thus, and as schematically represented in FIG. 7, the module according to the invention can be electrically supplied via a three phase supply member 62 in the form of a terminal block electrically connected to the input terminals A2, B2, C2 to deliver a first three phase output current to the terminals A1, B1, C1, and a second three phase output current to the terminals A3, B3, C3. The first output current corresponds to the supply current modulated by the first power component 26, and the second output current corresponds to the supply current modulated by the second power component 27, both power components being directly connected to the supply terminals A2, B2, C2 by means of the second set of bars 34.

Figure 9:
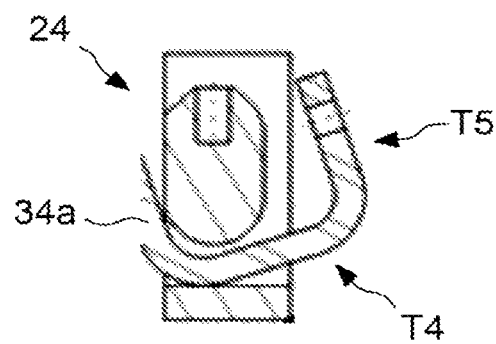
FIG. 9 is a cross-sectional view of a second step of unsecuring a power bar from the pedestal according to the invention.
Figure 10:
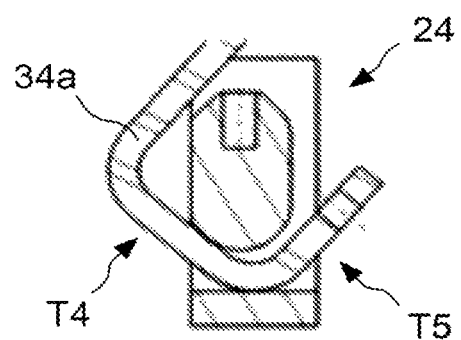
FIG. 10 is a cross-sectional view of a third step of unsecuring a power bar from the pedestal according to the invention.
Figure 11:
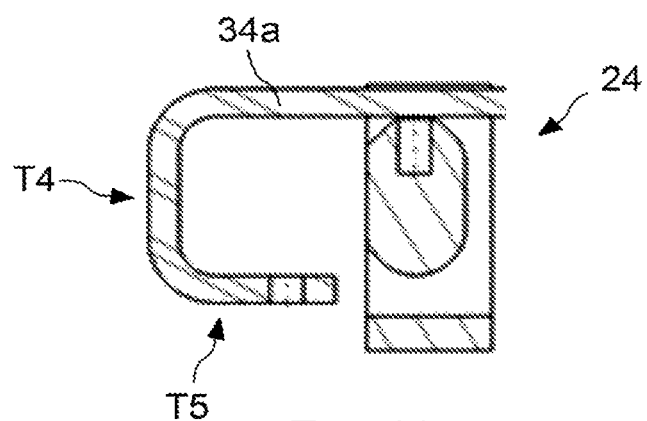
FIG. 11 is a cross-sectional view of a fourth step of unsecuring a power bar from the pedestal according to the invention.

As schematically illustrated in FIGS. 8 to 11, the choice of a pedestal comprising posts joined by bridges allows easy dismantling of the bars and of the entire electrical module. More particularly, the dismantling of the bar 34a to unsecure it from the pedestal 24 firstly consists in unscrewing its three attachment screws. This bar is then pushed to move its fourth section T4 away from the bridge that the end of this bar 34a surrounds, to be then pivoted about this bridge as illustrated in FIGS. 9 and 10. Once this pivoting is complete, the end of the bar, that is its fifth section T5, is completely disengaged from the opening of the pedestal, thus allowing the bar to be completely extracted.

Generally speaking, the pedestal according to the invention is suitable for receiving in the notches of its upper part the ends of three bars to attach them and electrically connect them to the base of the component it carries, and for three other bars in the openings located in its lower part to pass therethrough. These three other bars run under the power components, being closer to the plate and not necessarily connected to the component carried by the pedestal through which they pass.

The pedestal according to the invention thus makes it possible to implement in a modular manner an electrical distribution module arrangement that can be configured as required. Such a module comprises power components attached to its pedestals, and power bars that can run on several levels or stages, between the plate and the power components, while allowing the module with its power components and bars to be dismantled.

The invention claimed is:

1. An electrical distribution module, comprising a plate to which pedestals carrying power components and power bars connected to these power components are attached, wherein each pedestal of said pedestals comprises a base for attaching to the plate provided with posts spaced apart from each other and bridges each connecting two consecutive posts, each bridge being at a distance from the base to delimit, with said base and with the posts which it joins, an opening for a power bar to pass between the plate and the power component carried by said pedestal.

2. The module according to claim 1, wherein the posts of each pedestal protrude from the bridges in the opposite direction to the base in order to delimit, between each pair of consecutive posts, a notch suitable for receiving an end of the power bar.

3. The module according to claim 2, wherein each bridge of said bridges has a face opposite to the base wherein a threaded hole is formed, which receives a screw passing through a base of the power component carried by the pedestal and an end of the power bar received in the notch delimited by said bridge and the posts which it joins, in order to jointly attach the base of the power component to the pedestal and to electrically connect the end of the power bar to the base of the power component.

4. The module according to claim 3, wherein each bridge comprises a side face in which an additional threaded hole is formed, which receives a screw passing through a section of the power bar and an electrical terminal of a supply member to jointly attach the power bar to the bridge and electrically connect it to the electrical terminal of the supply member.

5. The module according to claim 1, wherein each power component of said power components is carried by two of said pedestals.

6. The module according to claim 1, wherein each pedestal comprises a hole at each end of its base through which it is attached by screwing to the plate.

7. The module according to claim 1, wherein each pedestal comprises studs protruding from its base and through which it is attached to the plate by fitting these studs into corresponding holes of the plate.

8. The module according to claim 1, wherein each pedestal of said pedestals comprises four of said posts to delimit three openings and three notches and wherein each pedestal of said pedestal carries a three phase power component, said three phase power component being one of said power components.

* * * * *